(12) United States Patent
Kurts et al.

(10) Patent No.: US 8,074,131 B2
(45) Date of Patent: Dec. 6, 2011

(54) GENERIC DEBUG EXTERNAL CONNECTION (GDXC) FOR HIGH INTEGRATION INTEGRATED CIRCUITS

(75) Inventors: Tsvika Kurts, Haifa (IL); Guillermo Savransky, Zichron Yakov (IL); Jason Ratner, Kfar Yonah (IL); Eilon Hazan, Hogla (IL); Daniel Skaba, Tel Aviv (IL); Sharon Elmosnino, Pardessia (IL); Geeyarpuram N. Santhanakrishnan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 216 days.

(21) Appl. No.: 12/495,583

(22) Filed: Jun. 30, 2009

(65) Prior Publication Data
US 2010/0332927 A1 Dec. 30, 2010

(51) Int. Cl.
*G01R 31/28* (2006.01)
(52) U.S. Cl. .............. 714/724; 714/28; 714/30; 714/25; 714/37; 714/39; 714/38.13; 714/45; 714/732; 714/734; 714/733; 703/23; 703/28; 703/26; 717/138; 717/134; 717/127; 717/124; 717/128
(58) Field of Classification Search .................. None
See application file for complete search history.

(56) References Cited

U.S. PATENT DOCUMENTS

| | | | |
|---|---|---|---|
| 5,848,264 A * | 12/1998 | Baird et al. ................. | 703/28 |
| 6,738,929 B2 * | 5/2004 | Swoboda et al. ............ | 714/28 |
| 7,058,855 B2 * | 6/2006 | Rohfleisch et al. .......... | 714/28 |
| 7,080,283 B1 * | 7/2006 | Songer et al. ............... | 714/30 |
| 7,107,494 B1 * | 9/2006 | Tischler ..................... | 714/43 |
| 7,627,784 B1 * | 12/2009 | Allen et al. ................. | 714/30 |
| 7,665,002 B1 * | 2/2010 | White et al. ................. | 714/733 |
| 7,848,913 B2 * | 12/2010 | Salmonsen ................... | 703/23 |
| 2005/0223359 A1 * | 10/2005 | Rao Nagaraju et al. ...... | 717/124 |
| 2005/0289400 A1 * | 12/2005 | Kimura ..................... | 714/45 |
| 2008/0126871 A1 * | 5/2008 | Nardini et al. .............. | 714/38 |
| 2009/0177923 A1 * | 7/2009 | McGowan ................... | 714/30 |
| 2010/0318972 A1 * | 12/2010 | Xu et al. .................... | 717/128 |

* cited by examiner

*Primary Examiner* — John Trimmings
(74) *Attorney, Agent, or Firm* — Blakely, Sokoloff, Taylor & Zafman LLP

(57) ABSTRACT

A high integration integrated circuit may comprise a plurality of processing cores, a graphics processing unit, and an uncore area coupled to an interface structure such as a ring structure. A generic debug external connection (GDXC) logic may be provisioned proximate to the end point of the ring structure. The GDXC logic may receive internal signals occurring in the uncore area, within the ring structure and on the interfaces provisioned between the plurality of cores and the ring structure. The GDXC logic may comprise a qualifier to selectively control the entry of the packets comprising information of the internal signals into the queue. The GDXC logic may then transfer the packets stored in the queues to a port provisioned on the surface of the integrated circuit packaging to provide an external interface to the analysis tools.

22 Claims, 5 Drawing Sheets

GENERIC DEBUG EXTERNAL CONNECTION (GDXC) FOR HIGH INTEGRATION INTEGRATED CIRCUITS

BACKGROUND

Advancements in integrated circuit process technology have enabled packing more circuitry or logic into the die space resulting in a highly integrated ICs (integrated circuits). An example of such highly integrated IC is one in which the memory controller, graphics processor, and multiple processing cores may be integrated in the same die. However, it is a highly challenging task to debug and validate a high integration integrated circuit due to low observability of internal signals at the external pins of the die or due to unavailability of internal signals, for example, front side bus, which is used as an interface between the integrated circuit and the peripherals. Such buses provided important hints about the internal signals, which enabled performing of root-cause analysis of many failures in the platform and the integrated circuit. The internal signals may provide an insight into the flow of the processor threads and operation of the functional units within the high integration integrated circuit. For example, the internal signals may provide failure data of the functional units such as the core area or uncore area of the high integrated ICs. Availability of such internal signals is critical for performing debug and validation of the high integrated ICs.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes embodiments of a technique to perform debugging and validation of a high integration integrated circuit. In the following description, numerous specific details such as logic implementations, resource partitioning, sharing, duplication implementations, types and interrelationships of system components, and logic partitioning or integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device).

For example, a machine-readable medium may include read only memory (ROM); random access memory (RAM); magnetic disk storage media; optical storage media; flash memory devices; electrical, optical, acoustical or other similar signals. Further, firmware, software, routines, and instructions may be described herein as performing certain actions. However, it should be appreciated that such descriptions are merely for convenience and that such actions in fact result from computing devices, processors, controllers, and other devices executing the firmware, software, routines, and instructions.

Figure 1:
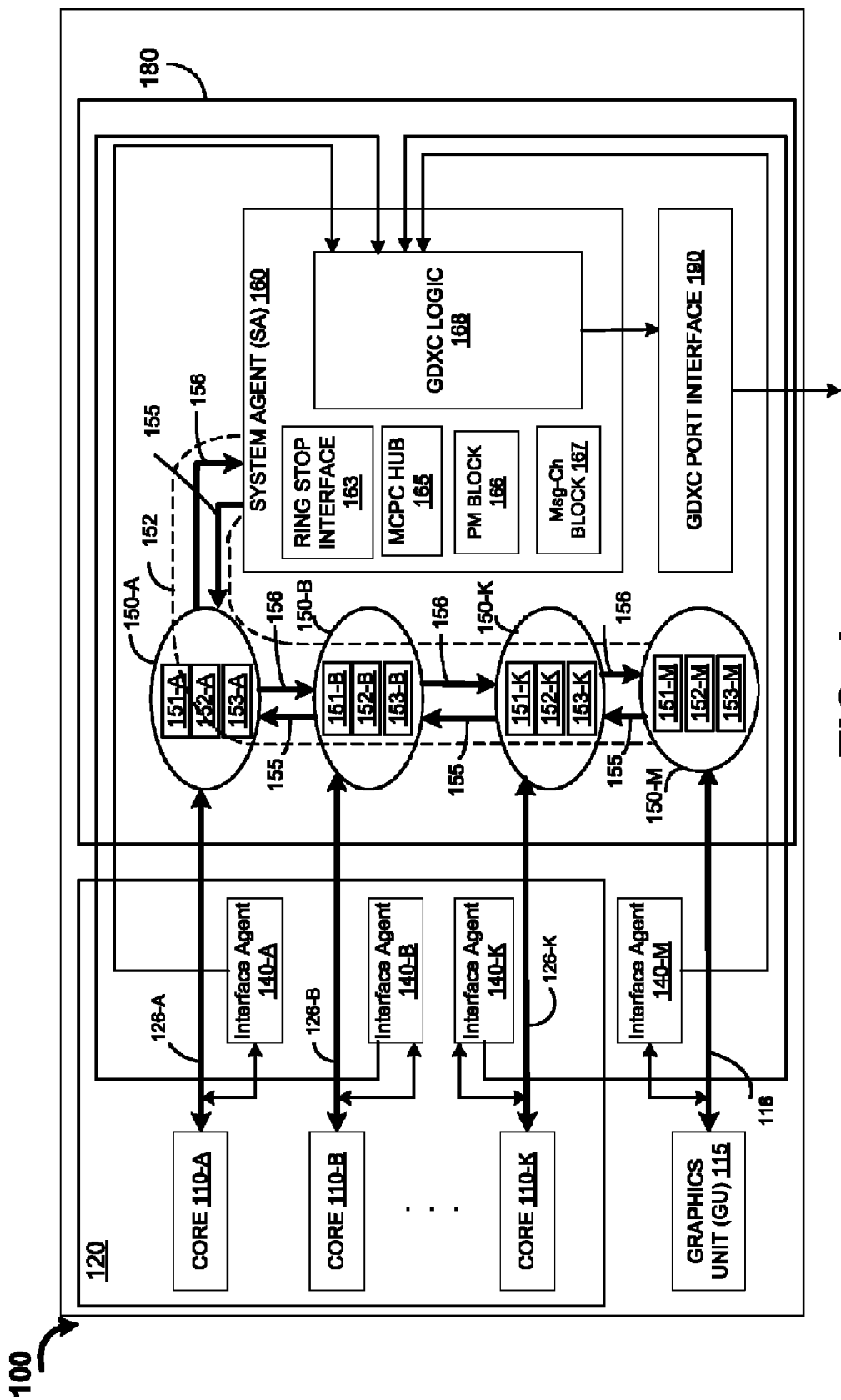
FIG. 1 illustrates a processor, which supports observability of internal signals to enable debugging and validation according to one embodiment.

An embodiment of the processor 100, which may support observability of internal signals to enable debug and validation of the highly integrated processor 100 is illustrated in FIG. 1. In one embodiment, the processor 100 may comprise a core area 120, a graphics unit 115, an uncore area 180, and a signal support structure based on a distributed protocol such as, for example, a ring structure 152. The description below is provided with reference to a processor 100 comprising a ring structure 152 provisioned to support communication between the core area 120 and the uncore area 180. However, GDXC techniques described below may be used in other embodiments that comprise non-ring structures and GDXC techniques support debugging and validation of such high integration integrated processor as well.

In one embodiment, the core area 120 may comprise core 110-A to 110-K, which may be coupled to the uncore area 180 using interfaces 126-A to 126-K, respectively. In one embodiment, the core area 120 may comprise interface agents 140-A to 140-K. In one embodiment, the interface agent 140-A may observe the internal signals transferred on the interface 126-A and may send the signals in the form of data units or packets to the uncore area 180. In one embodiment, the interface agents 140-B to 140-K may observe the signals transferred on the interfaces 126-B to 126-K, respectively, and send the data units to the uncore area 180. In one embodiment, the graphics unit 115 may be coupled to the uncore area 180 using an interface 116. In one embodiment, the interface agent 140-M coupled to the interface 116 may observe the signals transferred on the interface 116. In one embodiment, the interface agent 140-M may capture the internal signals on the interface 116 and may generate data units or packets before sending the data units to the uncore area 180.

In one embodiment, the uncore area 180 may couple the core area 120 to external system such as I/O system. In one embodiment, the uncore area 180 may supply data and code to the cores, handle system events such as interrupts, testability, and handle clock and power management. In one embodiment, the uncore area 180 may support integrated memory controller, integrated graphics controller, and interfaces to interconnects such as the peripheral component interconnect (PCI) express.

In one embodiment, the core interface 151-A may support interface between the core 110-A and the core interface 151-A may support protocols to handle requests, responses, and data transfer between the core 110-A and the uncore area 180. In one embodiment, the cache interface 152-A may handle requests for accessing the last level cache slice that are received from the core 110-A or other external requestors. In one embodiment, the cache interface 152-A may maintain cache coherency and may serve as a caching agent as well. In one embodiment, the ring interface 153-A may provide an interface to the ring 152 (comprising paths 155 and 156). In one embodiment, the ring interface 153-A may couple the interface end block 150-A to the system agent SA 168. In one embodiment, the ring interface 153-A may be shared by the core interface 151-A and the cache interface 152-A.

In one embodiment, the uncore area 180 may comprise one or more interface end blocks 150-A to 150-M, a system agent 160, and a DV port interface 190. In one embodiment, the interface end blocks 150-A to 150-M may be coupled to each other, for example, by a ring 152 comprising paths 155 and 156. In one embodiment, the interface end block 150-A may comprise a core interface 151-A, a cache interface 152-A, and a ring interface 153-A. In one embodiment, the interface end blocks 150-B to !50-M may each comprise (core interface 151-B, cache interface 152-B, ring interface 153-B), (core interface 151-K, cache interface 152-K, ring interface 153-K), and (core interface 151-M, cache interface !152-M, ring interface 153-M).

In one embodiment, the core 110-A may send an access request to access last level cache (LLC) slice associated with the interface end block 150-A. In one embodiment, the core interface 151-A and 152-A, in response to receiving the access request, may establish a connection, directly, with the cache interface 152-A. In one embodiment, the core interface 151-A and the cache interface 152-A may generate data units or packets that may comprise information of the transactions that occur between the core interface 151-A and the cache interface 152-A. In one embodiment, the interface end block 150-A may send such data units to the system agent 160.

In one embodiment, the core 110-A may send a read request to the interface end block 150-A to read data from the last level cache slice associated with the interface end block 150-K. In one embodiment, the core interface 151-A of the interface end block 150-A may request the ring interface 153-A to send the read request to the interface end block 150-K over the path 156 of an address and control portion of the ring 152. In one embodiment, the address and control ring portion of the ring 152 may support both coherent and non-coherent transactions. In one embodiment, the ring interface 153-K may communicate with the cache interface 152-K to access the LLC slice associated with the interface end block 150-K to retrieve the data requested for. In one embodiment, the cache interface !52-K may transfer the data to the ring interface 153-K and the ring interface 153-K may send the data (response) to the ring interface 153-A on the data ring portion of the ring 152. In one embodiment, the ring interface 153-A may communicate with the core interface 151-A to provide the data requested by the core 110-A. In one embodiment, the data portion of the ring may support data transfers and non-coherent transactions. In one embodiment, the interface end block 150-A and 150-K may exchange acknowledgements or other hand-shake signals on the acknowledgement and global observation portion of the ring 152.

In one embodiment, the interface end blocks 150-A to 150-M may send data units or packets that comprise information of the events or transactions that occur while transferring cache requests, I/O writes, acknowledgements, interrupts, power management transactions, log of architectural events such as a write to status registers and branch trace messages to the system agent 160. Also, in one embodiment, the data units may comprise information of power management transactions and states, message channel transfers, and such other information.

In one embodiment, the system agent 160 may comprise a ring stop interface 163, a memory control and peripheral control hub (MCPC) hub 165, a power management block 166, a msg-Ch block 167, and a GDXC logic 168. In one embodiment, the system agent 160 may comprise clock domains such as the uncore clock (UCLK), FCLK, and LCLK. In one embodiment, the system agent 160 may be provisioned at the end of the ring such that the GDXC logic 168 is enabled to observe internal signals of the processor 100. In one embodiment, the GDXC logic 168 may observe internal signals, which may comprise transactions, or events, or signals transferred between the core area 120, graphics unit 115 and the uncore area 180 over the interfaces 116 and 126, transactions within the interface end blocks 150, transactions on the paths 155 and 156 of the ring 152, power management transactions and states generated by the PM block 166, time stamped signals, and access signals to the registers in the uncore area 180 generated by the Msg-Ch block 167.

In one embodiment, the MCPC hub 165 may comprise a memory controller and a non-coherent traffic control unit, which may be provided with a FCLK. In one embodiment, the MCPC hub 165 may comprise peripheral and I/O devices controller, which may be provided with LCLK. In one embodiment, the ring stop interface 163 and the GDXC logic 168 may be provided with UCLK.

In one embodiment, the ring stop interface 163 may couple the system agent 180 to the ring 152. In one embodiment, the ring stop interface 163 may transfer the data units received from the interfaces 116 and 126, interface agents 140-A to 140-M, paths 155 and 156, the interface end points 150-A to 150-M, and such other sub-functional units with the graphics unit 115, the core area 120, and the uncore area 180 to the GDXC logic 168.

In one embodiment, the GDXC logic 168 may collect the data units received from the ring stop interface 163 and may filter the data units before storing the filtered in data units in memory spaces such as queues. In one embodiment, the GDXC logic 168 may collect the data units in a non-intrusive manner. In one embodiment, the GDXC logic 168 may collect the data units in an intrusive manner as well. In one embodiment, the GDXC logic 168 may collect the data in a condensed manner using packets. In one embodiment, the generic debug external connection logic may pack N internal signals into a packet before sending the packet to an external analysis tool. In one embodiment, the packet may comprise a collection of signals or transactions in a specific format. In one embodiment, the GDXC logic 168, the GDXC port interface 190, and an external logic analyzer tool may use the same packet format. In one embodiment, the GDXC logic 168 may provide the data units to the GDXC port interface 190. In one embodiment, the GDXC logic 168 provisioned at the end of the ring 152 may enable observability of the internal signals. In one embodiment, observing the internal signals and transferring the internal signals to the analysis tools and devices through an external debug port may facilitate debug and validation of the high integration integrated circuits such as the processor 100. In one embodiment, the GDXC logic 168 may be programmed using a programming port.

In one embodiment, the GDXC logic 168 may provide observability of ring structure comprising 150-A, 150-B, 150-K and 150-M and the paths 155 and 156. In one embodiment, the GDXC logic 168 may provide observability on one or more sub-rings of the paths 155 and 156. In one embodiment, the GDXC 168 may provide observability of Address and Control (AD) sub-ring used to support transfer of address and control information and coherent transactions, a BL sub-ring sub-ring used support transfer of data units and non-coherent transactions, an AK sub-ring used to support transfer of acknowledgements and global observation transactions, and a IV sub-ring used to support transfer of interrupts and lock transactions.

In one embodiment, the GDXC logic 168 may provide observability of in-die interface (IDI) paths such as the paths 116, 126-A to 126-K. In one embodiment, the amount of traffic on IDI paths 116 and 126-A to 126-K may be heavy and the heavy traffic may be filtered by the agents 140 to generate a subset of the heavy traffic. In one embodiment, the subset of the heavy traffic may be sent over a bus such as MCI bus and received by the GDXC logic 168. In one embodiment, the transfer of subset over the MCI bus may not interfere with the ring transactions providing non-intrusive observability.

In one embodiment, the GDXC logic 168 may provide observability of power management transactions and states. In one embodiment, the GDXC logic 168 may provide visibility of the power management components such as PCode (power control unit PCU firmware), power management (PM) link such as PM upstream and PM downstream, and serial VID (SVID) commands. In one embodiment, the GDXC logic 168 may provide observability of message channel transfers by capturing transactions or transfers on the message channel. In one embodiment, observability of the message channel transfers may provide observability of UNCORe configuration register accesses and backbone operations on the buses of the system agent 160.

In one embodiment, the GDXC logic 168 may provide observability of failure scenario by providing observability of signals that occurred prior to the failure, during the failure, and after the failure. In one embodiment, the GDXC packet format with a time-stamp technique may allow alignment of events based on time and may enable debugging of the failure scenario. In one embodiment, the GDXC logic 168 may enable debugging of external interfaces to the processor 100. In one embodiment, the architecture of the debug logic 168 and the position at which the debug logic 168 is provisioned may allow observability of transactions on the interfaces 116, 126-A to 126-K, ring 152, message channels, power management sequences and such other internal signals. Such internal signals may provide an insight into the operation of the functional units within the processor 100 and may provide information such as coreID, threadID, cache attributes, memory ordering, special cycles, code flow, power management, live lock, dead lock, true misses to the cache, uncacheable traffic, I/O traffic, snoop activity, non-coherent traffic, interrupts and such other information. Also, in one embodiment, the position of the debug logic 168 enables the debug logic 168 to watch the ring 152 for protocol correctness.

Figure 2:
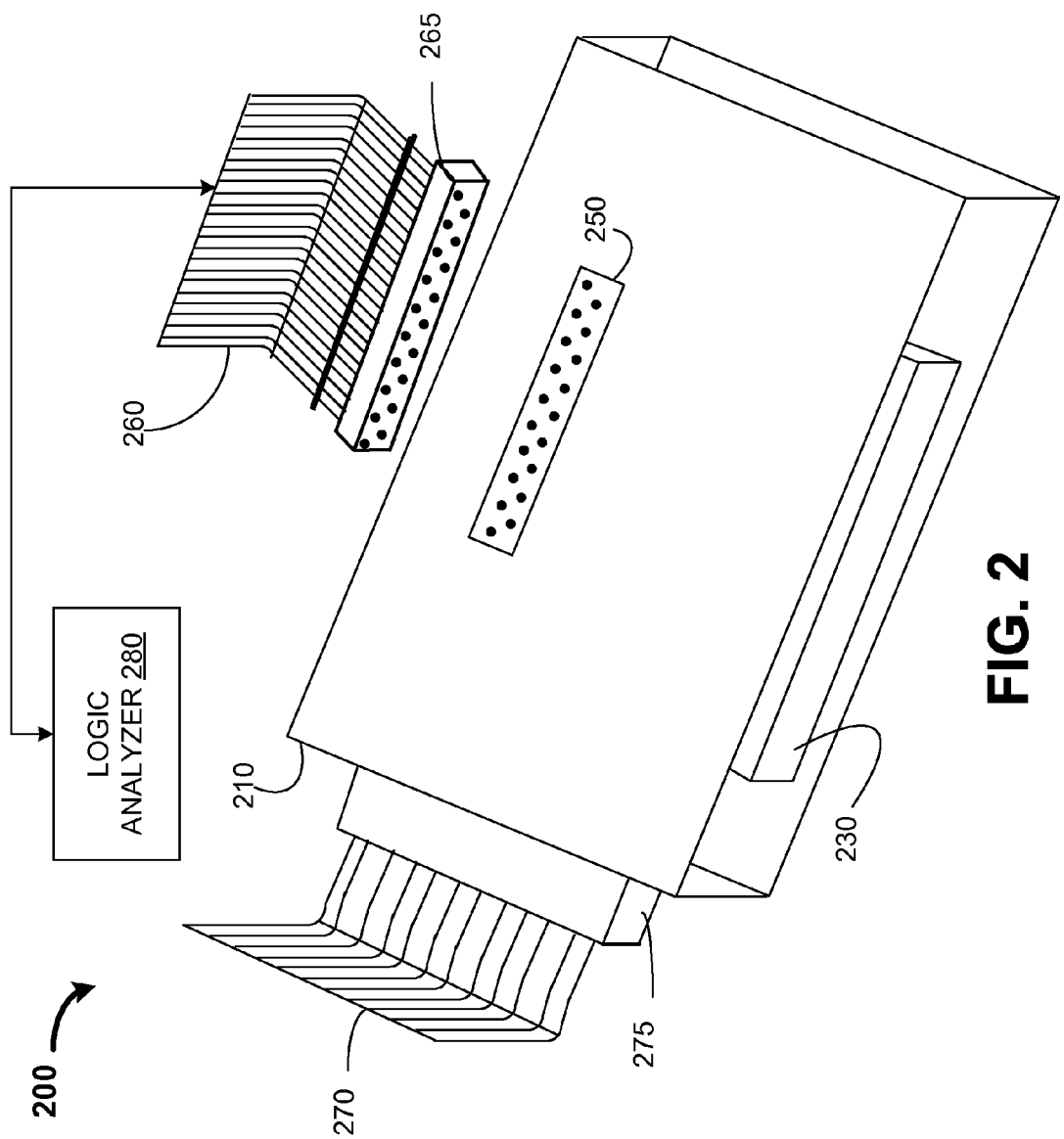
FIG. 2 illustrates an integrated circuit package 100, which may support debugging and validation of high integration integrated circuit according to one embodiment.

An embodiment of a high integration integrated circuit package 200, which may support debugging and validation of high integration integrated circuit is illustrated in FIG. 2. In one embodiment, a high integration high integrated circuit may comprise a memory controller, a graphics processing unit, and a multiple processing cores integrated on the same die. As a result of such high integration, accessing internal signals for debugging and validation of the processor becomes a challenge. In one embodiment, the package 200 may comprise an external packing 210, a processor 230, a topside debug and validation (DV) port 250, a debug and validation (DV) cable 260, a debug and validation (DV) connector 265, a program cable 270, a programming port 275, and a logic analyzer 280.

In one embodiment, the processor 230 may support a GDXC logic, which may observe, collect, and process the internal signals from the functional or sub-functional areas within the processor 230. In one embodiment, the program cable 270 and programming port 275 may be used to program the GDXC logic of the processor 230.

In one embodiment, the external packing 210 may support the DV port 250 and the processor 230 may use the DV port 250 to provide the internal signals to the external analysis tools such as the logic analyzer 280. In one embodiment, the DV port 250 may be provisioned on the topside of the external packing 210, which may allow the DV port 250 to be accessed with ease. However, in other embodiments, the DV port 250 may be provisioned on other surfaces of the external packing 210 as well. In one embodiment, the DV port 250 may share PCIe lanes or DDR channels, for example.

Figure 3:
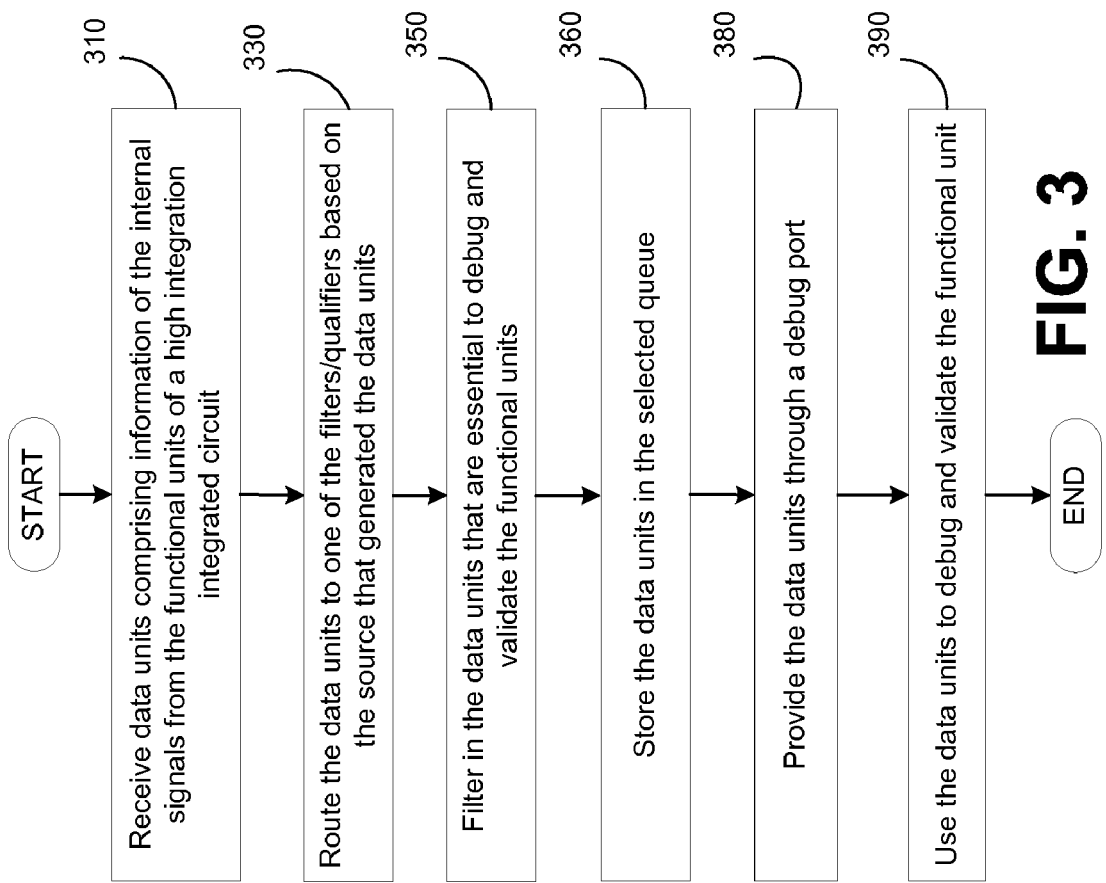
FIG. 3 is a flow-chart illustrating a technique to extract internal signals from within the high integration integrated circuit to be provided to the external tools for performing debugging and validation according to one embodiment.

An embodiment of the operation of the GDXC logic 168 to enable debugging and validation of high integration integrated circuits such as the processor 100 is illustrated in a flow-chart of FIG. 3.

In block 310, the GDXC logic 168 may receive the data units comprising information of the internal signals from the functional units of the high integration integrated circuit. In one embodiment, the GDXC logic 168 may receive data units from the interface agents 140-A to 140-M, interface end blocks 150-A to 150-M, ring portions such as the address and control (AD) sub-ring, BL sub-ring, acknowledgment (AK) sub-ring, and interrupt (IV) sub-ring In one embodiment, the GDXC logic 168 may receive data units comprising information of the traffic on IDI interfaces 116 and 126-A to 126-K, message channel transfers, power management transactions and states such as PCU firmware, PM link, and SVID commands, failure scenarios, and such other sources.

In block 330, the GDXC logic 168 may route the data units to one of the filters/qualifiers based on the source that generated the data units. In one embodiment, the data units that are generated by the interface agents 140-A to 140-M may be routed to a one filter and the data units generated by a portion of the ring 152 may be routed to a second filter/qualifier.

In block 350, the GDXC logic 168 may filter-in the data units that are essential for debugging and validating the functional units. In one embodiment, the GDXC logic 168 may look into the contents of the data units before determining whether to store the data units or to filter out the data units. In one embodiment, the GDXC logic 168 may determine whether the contents of the data units may be used for debugging and validating the processor 100.

In block 360, the GDXC logic 168 may store the filtered-in data units in a queue associated with the filter/qualifier. In one embodiment, the GDXC logic 168 may comprise a qualifier-queue combination for each type of data units. In one embodiment, the qualifiers may be used to select the data units such that the queues have memory space to store the data units without causing overflow. In one embodiment, the number of data units selected by the qualifier may depend on the bandwidth of the queues and the ports used to store and transfer data units. In one embodiment, if the qualifiers may avoid overflow of data units and thus avoid missing of failure information.

In block 380, the GDXC logic 168 may provide the data units stored in the queues to the DV interface 190. In block 390, the data units provided to the external tools may be used to perform debugging and validation of the high integration integrated circuit.

Figure 4:
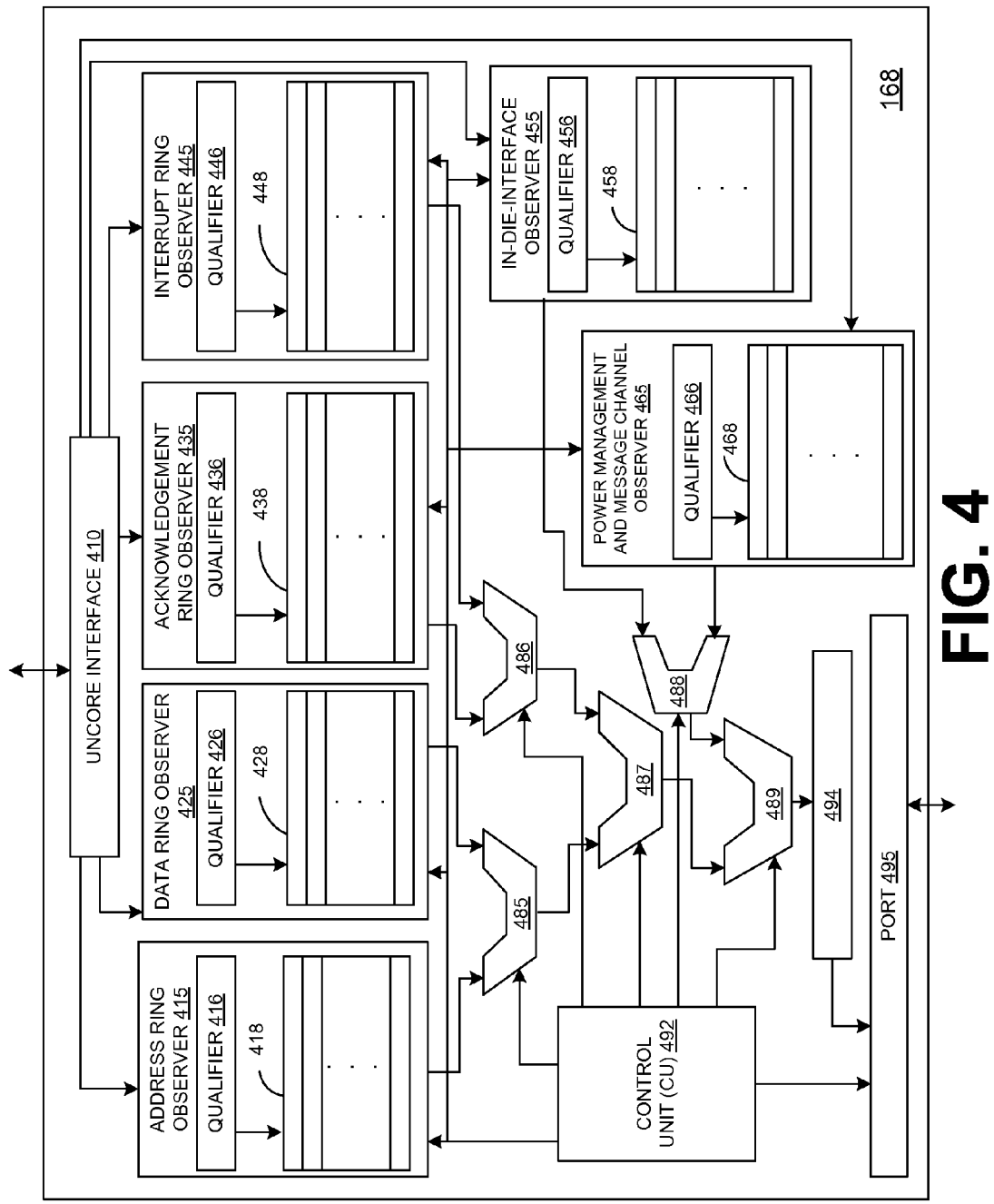
FIG. 4 illustrates a debug logic, which may capture internal signals before providing the internal signals to the external tools according to one embodiment.

An embodiment of the GDXC logic 168, which may observe, capture and transfer internal signals to facilitate debugging and validation of high integration integrated circuit is illustrated in FIG. 4. In one embodiment, the GDXC logic 168 may comprise a uncore interface 410, address ring observer 415, data ring observer 425, acknowledgement ring observer 435, interrupt ring observer 445, in-die-interface (IDI) observer 455, power management (PM) and message channel (MC) PMMC observer 465, multiplexers MUX 485 to 489, a control unit 492, and a port control unit 495. In one embodiment, the GDXC logic 168 may operate on uncore clock (UCLK) provided by the clock domain of the uncore area 180.

In one embodiment, the uncore interface 410 may receive the data units or packets from different functional units of the processor 100 and route the data units to one of the observer blocks 415, 425, 435, 445, 455, or 465. In one embodiment, the uncore interface 410 may receive data units from the interface agents 140-A to 140-M, interface end blocks 150-A to 150-M, portions of the ring 152, power management block and message channels and forward the data units to one of the observer blocks 415-465. In one embodiment, the uncore interface 410 may receive data units generated by the AD, BL, AK, and IV sub-rings of the ring 152 and may forward the data units to the observers 415 to 445, respectively. In one embodiment, the uncore interface 410 may receive data units transferred on IDI interfaces 116 and 126-A to 126-K and forward the data units to the In-die interface (IDI) observer 455. In one embodiment, the uncore interface 410 may receive data units comprising information of a power management sequence and message channeling and may forward the data units to the PMMC observer 465.

In one embodiment, the address ring observer 415 may comprise a qualifier 416 and a queue 418. In one embodiment, the qualifier 416 may control the entry of data units into the queue 418 based on the contents of the data unit and the usefulness of contents of the data unit for debugging and validation of the high integration integrated circuit such as the processor 100. In one embodiment, the qualifier 416 may affix a time stamp to the data units that are allowed to enter the queue 418. Similarly, the data units received from BL, AK, IV sub-rings, IDI interfaces, power management and message channel may be selected by the qualifiers 426 to 466, respectively. In one embodiment, the qualifiers 426 to 466 may add timestamp to the data units before storing the selected data units in the queues 418 to 468, respectively. In one embodiment, affixing time stamps to data units stored in the queues 418 to 468 may enable the processor 100 to be immune to latency. In one embodiment, the size of the data unit that may be stored in the queues 418 to 468 may equal 32 bits, 64 bits, 96 bits, or 128 bits. In one embodiment, the data units stored in the queues 418 to 468 may be sent over X16 PCIe lanes.

In one embodiment, the MUX 485-489 may allow selection of data units from the queues 418 to 468. In one embodiment, the output of the MUX 489 may be provided as an input to a memory 496 of the port control unit 495. In one embodiment, the MUX 485 to 489 may be used to control the transfer of the data units from the queues 418 to 468 to a bubble generator first-in first-out (FIFO) BGF 494.

In one embodiment, the control unit 492 may control the selection and time stamping operations of the qualifiers 416 to 466. In one embodiment, the control unit 492 may support post-processing software, which may layout the data units in a chronological order based on the time stamp associated with the data units. In one embodiment, the control unit CU 492 may generate the select inputs to the MUX 485 to 489 based on arbitration logic that may control the manner and the order of the data units that may be evicted from the queues 418 to 468. In one embodiment, the control unit 492 may control outflow of the data units from the queues 418 to 468 by using techniques such as arbitration and multiplexing. In one embodiment, the control unit 492 may use arbitration logic such as a weighted round robin technique for slow protocols (e.g., power management) and in-order arbitration technique for fast protocols (e.g., ring). In one embodiment, the data units stored in the BGF 494 may be transferred to the GDXC port interface 190 a port 495.

Figure 5:
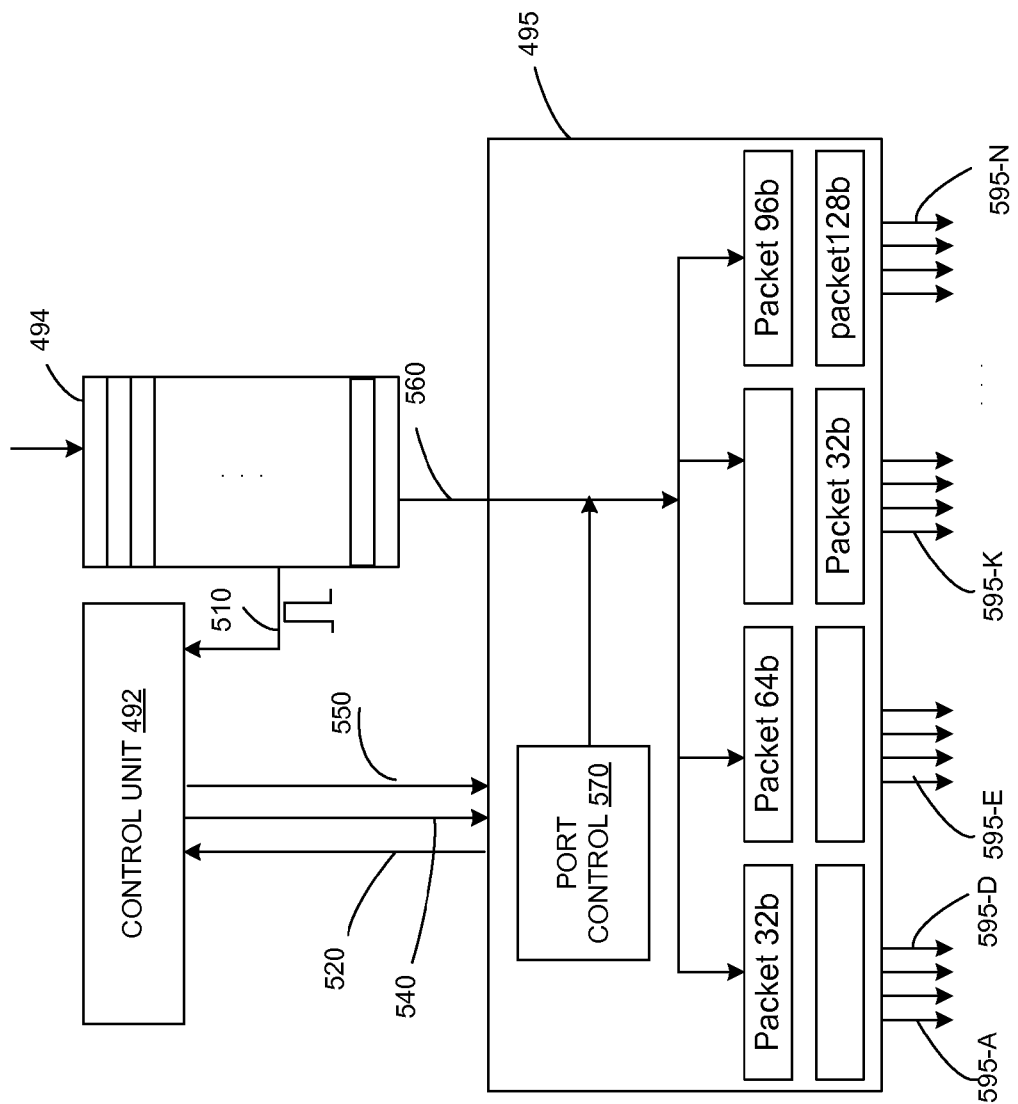
FIG. 5 illustrates a handshake between queues and the port control unit of the debug logic according to one embodiment.

An embodiment of an interface technique to convert the GDXC internal packet format to a known interface format to allow seamless interface to the logic analyzer is illustrated in FIG. 5. In one embodiment, the data units stored in the BGF 494 may be transferred to logic analyzer 280 through the port 495. However, the internal GDXC packet format may be converted into a known interface format, which may be processed by the logic analyzer 280. In one embodiment, the packet format may be based on a robust protocol. For example, a packet format based on the robust protocol may comprise a start field and an end field. In one embodiment, the start field may comprise bits such as a start bit, packet size, and time stamp, for example.

In one embodiment, the BGF 494 and the port 495 may use credit based protocol to transfer data units from the BGF 494 to the port 495. In one embodiment, the packets stored in the BGF 494 may be transferred on, for example, PCIe transmit lanes. In one embodiment, the port 495 may communicate with the GDXC physical layer using a credit based handshake protocol. In one embodiment, each time a 128 bit data unit or 4 chunks of 32 bit data is sent out on an interconnect such as a PCIe transmit lanes 595-A to 595-N from the BGF 494, a space for storing an entry in the BGF 494 is available. In one embodiment, the BGF 494 may cause a credit pulse 510 to be sent to the control unit 492 indicating that an entry from the queues 418 to 468 may be delivered to the BGF 494. In one embodiment, the credit pulse on path 510 may initiate a transfer of n×4 chunks to the top of the BGF 494. In one embodiment, if the size of the data unit or a packet exceeds 128-bit or the $4^{th}$ chunk, the port control 570 may automatically wrap around the data unit to the next symbol clock.

In one embodiment, in order to increase the robustness of a communication channel between the GDXC port 495 to the logic analyzer 280, a cyclic redundancy check (CRC) packet is 128-bit aligned. In one embodiment, to avoid wrap around, the CRC packet may start at lane 0 of the PCI-e transmit lanes and the size of the packet is 128 bits. In one embodiment, the fixed location of the start of the CRC packet at lane 0 allows the logic analyzer 280 to be identified with ease. In one embodiment, the port control 570 may generate a 'Request Unbroken' signal 520, which may be sent to the control unit 492. In one embodiment, the port control 570 may send the 'Request Unbroken' signal 520 each time the CRC packet is inserted. In one embodiment, the 'Request Unbroken' signal 520 is generated by the port control 570 to avoid a CRC packet breaking a 128-bit data unit. In one embodiment, the port control 570 may receive an 'Unbroken' signal 540 and may insert a CRC packet in response to receiving the 'Unbroken' signal 540. In one embodiment, the port control 570 may arrange the chunks in an order before delivering the ordered chunks on the interconnect PCIe lanes 595. In one embodiment, the port control 570 may cause the data units or chunks to be delivered to the GDXC port interface 190. In one embodiment, the PCIe lanes 595 may operate at rates of a Gen2 (5 gigahertz) or Gen1 (2.5 gighertz).

In one embodiment, in response to receiving the 'Request Unbroken' signal 520, the control unit 494 may cause the 4 chunks or 128-bit packet from the BGF 494 to be delivered and may then send a 'Valid' signal 550. In one embodiment, the control unit 492 may send an 'Unbroken' signal on 540 while the data unit is 128-bit aligned. In one embodiment, the port control 570 may insert a periodic time synchronization packet such as COM/Skip/Skip/Skip in PCI-e standard. In one embodiment, the CRC and COM/SKP/SKP/SKP may be optionally handshaked between the port 495 and the control unit 492 to ensure higher reliability of communication between the GDXC logic 168 and the logic analyzer 280.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is

1. An integrated circuit to support debug and validation activity comprising:
   a core area comprising a plurality of processing cores,
   a graphics processing unit coupled to the plurality of processing cores, and
   an uncore area coupled to the core area and the graphics processing unit, wherein the uncore area further comprises a generic debug external connection logic,
   wherein the generic debug external connection logic is to capture internal signals that occur between the plurality of cores, between the core area and the uncore area, and within the uncore area,
   wherein the generic debug external connection logic is coupled to a port, wherein the generic debug external logic is to transfer the internal signals to external analysis tools through the port,
   wherein the generic debug external connection logic is coupled to an end point of a first interface structure provisioned to transfer signals between the core area, the graphics processing unit, and the uncore area,
   wherein the port is provisioned on a surface of a packing, which encloses the integrated circuit,
   wherein the integrated circuit does not expose buses provisioned between the uncore area and peripherals to capture the internal signals,
   wherein the integrated circuit further comprises one or more interface agents, wherein the one or more interface agents are to transfer the internal signals occurring on one or more second interface structures provisioned between the plurality of cores and the first interface structure to the generic debug external connection logic,
   wherein the internal signals comprise signals transferred on the first interface structure, wherein the internal signals comprise power management sequences generated by a power management block.

2. The integrated circuit of claim 1, wherein the internal signals comprise message channel signals generated by a message channel block, wherein the message channel signal include access signals to one or more registers provisioned within the uncore area.

3. The integrated circuit of claim 1, wherein the generic debug external connection provisioned proximate to the end point of the first interface structure is to enable observability of the internal signals.

4. The integrated circuit of claim 1, wherein the generic debug external connection logic is to pack internal signals into a packet before sending the packet to the external analysis tools.

5. The integrated circuit of claim 4, wherein the generic debug external connection logic is to generate the packet in a standard interface format before sending the packet to the external analysis tool.

6. The integrated circuit of claim 1, wherein the port is provisioned on a top-side of the packing enclosing the integrated circuit.

7. A general debug external connection logic to debug and validate a processor comprising:
   an uncore interface, wherein the uncore interface is to receive internal signals from a core area, a graphics processing unit, and an uncore area,
   a plurality of observer blocks coupled to the uncore interface, wherein each of the plurality of observer blocks is to selectively store the internal signals received from the uncore interface, and
   a control unit coupled to the plurality of observer blocks, wherein the control unit is to control the flow of the internal signals from the plurality of observers to a port,
   wherein the uncore interface is to, route the internal signals to plurality of observers based on the source of the internal signals and receive the internal signals that include signals occurring between cores of the core area, between the core area and the uncore area, and within the uncore area,
   wherein the internal signals occur between the plurality of cores, between the core area and the uncore area, and within the uncore area,
   wherein the internal signals are transferred to external analysis tools through the port for debugging and validation,
   wherein the internal signals include power sequences, access signals to the registers, in-die interface signals, and signals on an interface coupling the core area and the uncore area,
   wherein buses provisioned between the uncore area and peripherals are not exposed to capture the internal signals.

8. The general debug external connection logic of claim 7 each of the plurality of observers further comprise a qualifier and a queue, wherein the queue is coupled to the qualifier, wherein the qualifier is to control the entry of internal signals to the queue.

9. The general debug external connection logic of claim 8, wherein the qualifier is to affix a time stamp to the internal signals before storing the internal signals in the queue, wherein the control unit is to generate control signals for the qualifier, wherein the internal signals are stored in the form of packets.

10. The general debug external connection logic of claim 8 further comprises a plurality of multiplexers coupled to the control unit and the queue of each of the plurality of observers, wherein the control unit is to control the plurality of multiplexers to select the packets stored in the queue of each of the plurality of observers.

11. The general debug external connection logic of claim 10, wherein the control unit is to control the plurality of multiplexers based on an arbitration logic, wherein the arbitration logic includes a weighted round robin protocol.

12. The general debug external connection logic of claim 10, wherein the control unit is to control the plurality of multiplexers based on an arbitration logic, wherein the arbitration logic includes an in-order protocol.

13. The general debug external connection logic of claim 10 further comprises a bubble generator first-in-first-out memory coupled to the output of a last multiplexer of the plurality of multiplexers, wherein the bubble generator first-in-first-out memory is to store the internal signals selected by the plurality of multiplexers.

14. The general debug external connection logic of claim 13, wherein the port further comprises a port control, wherein the port control is to align the packets to avoid wrap around of the packets.

15. The general debug external connection logic of claim 14, wherein the port control is to convert internal format of the packets to a standard interface packet format.

16. The general debug external connection logic of claim 13, wherein the packets in the bubble generator first-in-first-out memory is transferred to the port based on a credit based protocol.

17. A method to debug and validate a processor comprising:
receiving internal signals in an uncore area from an uncore interface, wherein the uncore area is to receive the internal signals from a core area, a graphics processing unit, and the uncore area,
selectively storing the internal signals received from the uncore interface, wherein the internal signals are stored in a plurality of observer blocks coupled to the uncore interface, and
generating control signals to control the flow of internal signals from the plurality of observer blocks to a port, wherein a control unit coupled to the plurality of observer blocks is to generate the control signals,
wherein the internal signals occur between the plurality of cores, between the core area and the uncore area, and within the uncore area,
wherein the internal signals are transferred to external analysis tools through the port for debugging and validation,
wherein the internal signals include signals occurring between cores of the core area, between the core area and the uncore area, and within the uncore area, wherein the internals signals further include power sequences, access signals to the registers, in-die interface signals, and signals on an interface coupling the core area and the uncore area,
wherein buses provisioned between the uncore area and peripherals are not exposed to capture the internal signals.

18. The method of claim 17 comprises,
filtering entry of internal signals to a queue coupled to a qualifier, and
affixing a time stamp to the internal signals before storing the internal signals in the queue, wherein each of the plurality of observers further comprise the qualifier and the queue
wherein the control unit is to generate control signals for the qualifier, wherein the internal signals are stored in the form of packets.

19. The method of claim 17 further comprises generating select signals to a plurality of multiplexers to select the packets stored in the queue of each of the plurality of observers, wherein the plurality of multiplexers are coupled to the control unit and the queue of each of the plurality of observers.

20. The method of claim 19 further comprises generating the select signals based on an arbitration logic, wherein the arbitration logic includes a weighted round robin protocol.

21. The method of claim 20 further comprises storing selected packets in a bubble generator first-in-first-out memory, wherein the bubble generator first-in-first-out memory is coupled to the output of a last multiplexer of the plurality of multiplexers, wherein the selected packets represent the internal signals selected by the plurality of multiplexers.

22. The method of claim 21 further comprises,
converting internal format of the selected packets to a standard interface packet format,
aligning the selected packets before sending the selected packets through the packet to avoid wrap around of the packets, and
transferring the selected packets from the bubble generator first-in-first-out memory to the port based on a credit based protocol.

* * * * *